United States Patent
Im et al.

(10) Patent No.: US 7,399,359 B2
(45) Date of Patent: Jul. 15, 2008

(54) METHOD AND SYSTEM FOR PROVIDING A THIN FILM WITH A CONTROLLED CRYSTAL ORIENTATION USING PULSED LASER INDUCED MELTING AND NUCLEATION-INITIATED CRYSTALLIZATION

(75) Inventors: James S. Im, New York, NY (US); Jae Beom Choi, Palisades Park, NJ (US)

(73) Assignee: The Trustees of Columbia University in theCity of New York, New York, NY (US)

( * ) Notice: Subject to any disclaimer, the term of this patent is extended or adjusted under 35 U.S.C. 154(b) by 166 days.

(21) Appl. No.: 10/953,312

(22) Filed: Sep. 29, 2004

(65) Prior Publication Data
US 2006/0006464 A1     Jan. 12, 2006

Related U.S. Application Data

(63) Continuation of application No. PCT/US03/09861, filed on Apr. 1, 2003.

(60) Provisional application No. 60/369,186, filed on Apr. 1, 2002.

(51) Int. Cl.
*H01L 21/00*     (2006.01)
*H01L 21/31*     (2006.01)

(52) U.S. Cl. .................. 117/107; 438/149; 438/795; 257/E21.582

(58) Field of Classification Search ............ 438/149, 438/795; 117/107
See application file for complete search history.

(56) References Cited

U.S. PATENT DOCUMENTS

| | | | |
|---|---|---|---|
| 3,632,205 | A | 1/1972 | Marcy |
| 4,234,358 | A | 11/1980 | Celler et al. |
| 4,309,225 | A | 1/1982 | Fan et al. |

(Continued)

FOREIGN PATENT DOCUMENTS

EP     681316     8/1995

(Continued)

OTHER PUBLICATIONS

U.S. Appl. No. 60/253,256, filed Aug. 31, 2003, Im.

(Continued)

*Primary Examiner*—Alexander G Ghyka
(74) *Attorney, Agent, or Firm*—Baker Botts LLP

(57) ABSTRACT

Method and system for generating a metal thin film with a uniform crystalline orientation and a controlled crystalline microstructure are provided. For example, a metal layer is irradicated with a pulsed laser to completely melt the film throughout its entire thickness. The metal layer can then resolidify to form grains with a substantially uniform orientation. The resolidified metal layer can be irradiated with a sequential lateral solidification technique to modify the crystalline microstructure (e.g., create larger grains, single-crystal regions, grain boundary controlled microstructures, etc.) The metal layer can be irradiated by patterning a beam using a mask which includes a first region capable of attenuating the pulsed laser and a second region allowing complete irradiation of sections of the thin film being impinged by the masked laser beam. An inverse dot-patterned mask can be used, the microstructure that may have substantially the same as the geometric pattern as that of the dots of the mask.

14 Claims, 7 Drawing Sheets

U.S. PATENT DOCUMENTS

| | | | |
|---|---|---|---|
| 4,382,658 A | 5/1983 | Shields et al. | |
| 4,456,371 A | 6/1984 | Lin | |
| 4,639,277 A | 1/1987 | Hawkins | |
| 4,691,983 A | 9/1987 | Kobayashi et al. | |
| 4,727,047 A | 2/1988 | Bolzer et al. | |
| 4,758,533 A * | 7/1988 | Magee et al. | 438/662 |
| 4,793,694 A | 12/1988 | Liu | |
| 4,800,179 A | 1/1989 | Mukai | |
| 4,855,014 A | 8/1989 | Kakimoto et al. | |
| 4,870,031 A | 9/1989 | Sugahara et al. | |
| 4,940,505 A | 7/1990 | Schachameyer et al. | |
| 4,970,546 A | 11/1990 | Suzuki et al. | |
| 4,977,104 A | 12/1990 | Sawada et al. | |
| 5,032,233 A | 7/1991 | Yu et al. | |
| 5,061,655 A | 10/1991 | Ipposhi et al. | |
| RE33,836 E | 3/1992 | Resor, III et al. | |
| 5,145,808 A | 9/1992 | Sameshima et al. | |
| 5,204,659 A | 4/1993 | Sarma | |
| 5,233,207 A | 8/1993 | Anzai | |
| 5,285,236 A | 2/1994 | Jain | |
| 5,291,240 A | 3/1994 | Jain | |
| 5,304,357 A | 4/1994 | Sato et al. | |
| 5,373,803 A | 12/1994 | Noguchi et al. | |
| 5,395,481 A | 3/1995 | McCarthy | |
| 5,409,867 A | 4/1995 | Asano | |
| 5,453,594 A | 9/1995 | Konecny | |
| 5,456,763 A | 10/1995 | Kaschmitter et al. | |
| 5,496,768 A | 3/1996 | Kudo | |
| 5,523,193 A | 6/1996 | Nelson | |
| 5,529,951 A | 6/1996 | Noguchi et al. | |
| 5,591,668 A | 1/1997 | Maegawa et al. | |
| 5,721,606 A | 2/1998 | Jain | |
| 5,742,426 A | 4/1998 | York | |
| 5,756,364 A | 5/1998 | Tanaka et al. | |
| 5,766,989 A | 6/1998 | Maegawa et al. | |
| 5,844,588 A | 12/1998 | Anderson | |
| 5,861,991 A | 1/1999 | Fork | |
| 5,893,990 A | 4/1999 | Tanaka | |
| 5,986,807 A | 11/1999 | Fork | |
| 6,014,944 A | 1/2000 | Russell et al. | |
| 6,072,631 A | 6/2000 | Guenther et al. | |
| 6,081,381 A | 6/2000 | Shalapenok et al. | |
| 6,117,752 A | 9/2000 | Suzuki | |
| 6,120,976 A | 9/2000 | Treadwell et al. | |
| 6,130,009 A | 10/2000 | Smith et al. | |
| 6,130,455 A | 10/2000 | Yoshinouchi | |
| 6,156,997 A | 12/2000 | Yamazaki et al. | |
| 6,162,711 A | 12/2000 | Ma et al. | |
| 6,169,014 B1 | 1/2001 | McCulloch | |
| 6,172,820 B1 | 1/2001 | Kuwahara | |
| 6,177,301 B1 | 1/2001 | Jung | |
| 6,187,088 B1 | 2/2001 | Okumura | |
| 6,190,985 B1 | 2/2001 | Buynoski | |
| 6,193,796 B1 | 2/2001 | Yang | |
| 6,203,952 B1 | 3/2001 | O'Brien et al. | |
| 6,235,614 B1 | 5/2001 | Yang | |
| 6,242,291 B1 | 6/2001 | Kusumoto et al. | |
| 6,285,001 B1 | 9/2001 | Fleming et al. | |
| 6,300,175 B1 | 10/2001 | Moon | |
| 6,313,435 B1 | 11/2001 | Shoemaker et al. | |
| 6,316,338 B1 | 11/2001 | Jung | |
| 6,320,227 B1 | 11/2001 | Lee et al. | |
| 6,322,625 B2 | 11/2001 | Im | 117/43 |
| 6,326,286 B1 | 12/2001 | Park et al. | |
| 6,333,232 B1 | 12/2001 | Kunikiyo | |
| 6,368,945 B1 | 4/2002 | Im | 438/487 |
| 6,388,146 B1 | 5/2002 | Onishi et al. | 570/128 |
| 6,407,012 B1 | 6/2002 | Miyasaka et al. | 438/788 |
| 6,444,506 B1 | 9/2002 | Kusumoto et al. | |
| 6,468,845 B1 | 10/2002 | Nakajima et al. | 438/166 |
| 6,495,067 B1 | 12/2002 | Ono | 252/299.61 |
| 6,511,718 B1 | 1/2003 | Paz de Araujo et al. | 427/576 |
| 6,521,492 B2 | 2/2003 | Miyasaka et al. | 438/166 |
| 6,526,585 B1 | 3/2003 | Hill | |
| 6,528,359 B2 | 3/2003 | Kusumoto et al. | |
| 6,555,449 B1 | 4/2003 | Im et al. | 438/487 |
| 6,563,077 B2 | 5/2003 | Im | |
| 6,573,531 B1 | 6/2003 | Im et al. | |
| 6,582,827 B1 | 6/2003 | Im | |
| 6,621,044 B2 | 9/2003 | Jain et al. | |
| 6,635,554 B1 | 10/2003 | Im et al. | |
| 6,767,804 B2 * | 7/2004 | Crowder | 438/487 |
| 6,830,993 B1 | 12/2004 | Im et al. | |
| 2001/0001745 A1 | 5/2001 | Im et al. | |
| 2001/0041426 A1 | 11/2001 | Im | |
| 2002/0104750 A1 | 8/2002 | Ito | |
| 2003/0029212 A1 | 2/2003 | Im | |
| 2003/0096489 A1 | 5/2003 | Im et al. | |
| 2003/0119286 A1 | 6/2003 | Im et al. | |
| 2004/0053450 A1 | 3/2004 | Sposili et al. | |
| 2004/0061843 A1 | 4/2004 | Im | |
| 2005/0032249 A1 | 2/2005 | Im et al. | |
| 2005/0034653 A1 | 2/2005 | Im et al. | |

FOREIGN PATENT DOCUMENTS

| | | |
|---|---|---|
| EP | 655774 | 7/1996 |
| EP | 1067593 | 10/2001 |
| GB | 2338342 | 12/1999 |
| GB | 2338343 | 12/1999 |
| GB | 2338597 | 12/1999 |
| JP | 62181419 | 8/1987 |
| JP | 2283036 | 11/1990 |
| JP | 04033327 | 2/1992 |
| JP | 6252048 | 9/1994 |
| JP | 6283422 | 10/1994 |
| JP | 7176757 | 7/1995 |
| JP | 11064883 | 3/1999 |
| JP | 2001023920 | 1/2001 |
| WO | 9745827 | 12/1997 |
| WO | 9824118 | 6/1998 |
| WO | 9931719 | 6/1999 |
| WO | 0014784 | 3/2000 |
| WO | 0118854 | 3/2001 |
| WO | 0118855 | 3/2001 |
| WO | 0171786 | 9/2001 |
| WO | 0231869 | 4/2002 |
| WO | 02031869 | 4/2002 |
| WO | 0242847 | 5/2002 |
| WO | 02086954 | 5/2002 |
| WO | 02086954 | 10/2002 |
| WO | 02086955 | 10/2002 |
| WO | 03018882 | 3/2003 |
| WO | 03046965 | 6/2003 |
| WO | 04075263 | 8/2003 |
| WO | 03084688 | 10/2003 |
| WO | 04017379 | 2/2004 |
| WO | 04017380 | 2/2004 |
| WO | 04017381 | 2/2004 |
| WO | 04017382 | 2/2004 |

OTHER PUBLICATIONS

Im et al., "Controlled Super-Lateral Growth of Si Films for Microstructural Manipulation and Optimization", Phys. Stat. Sol. (a), vol. 166, p. 603 (1998).

S.D. Brotherton et al., "Influence of Melt Depth in Laser Crystallized Poly-Si Thin Film Transistors," 82 J. Appl. Phys. 4086 (1997).

J.S. Im et al., "Crystalline Si Films for Integrated Active-Matrix Liquid-Crystals Displays," 21 MRS Bulletin 39 (1996).

Im et al., "Single-Crystal Si Films for Thin-Film Transistor Devices," Appl. Phys. Lett., vol. 70 (25), p. 3434 (1997).

Sposili et al., "Sequential Lateral Solidification of Thin Silicon Films on SiO2", Appl, Phys. Lett., vol. 69 (19), p. 2864 (1996).

Crowder et al., "Low-Temperature Single-Crystal Si TFT's Fabricated on Si Films processed via Sequential Lateral Solidification", IEEE Electron Device Letter, vol. 19 (8), p. 306 (1998).

Sposili et al., "Single-Crystal Si Films via a Low-Substrate-Temperature Excimer-Laser Crystallization Method", Mat. Res. Soc. Symp. Proc. vol. 452, pp. 953-958, 1997 Materials Reasearch Society.

C. E. Nebel, "Laser Interference Structuring of A-SI:h" Amorphous Silicon Technology—1996, San Francisco, CA Apr. 8-12, 1996, Materials Research Society Symposium Proceedings, vol. 420, Pittsburgh, PA.

J. H. Jeon et al., "Two-step laser recrystallization of poly-Si for effective control of grain boundaries", Journal of Non Crystalline Solids, North-Holland Publishing Company, NL, vol. 266-269, May 2000, pp. 645-649.

H. Endert et al., "Excimer Laser: A New Tool for Precision Micromaching," 27 Optical and Quantum Electronics, 1319 (1995).

"Overview of Beam Delivery Systems for Excimer Lasers," Micro/Las Lasersystem GMBH.

K.H. Weiner et al., "Ultrashallow Junction Formation Using Projection Gas Immersion Laser Doping (PGILD)," A Verdant Technologies Technical Brief, Aug. 20, 1997.

Hau-Riege C.S. et al., "The Effects Microstructural Transitions at Width Transitions on interconnect reliabity," Journal of Applied Physics, Jun. 15, 2000, vol. 87, No. 12, pp. 8467-8472.

McWilliams et al., "Wafer-Scale Laser Pantography: Fabrication of N-Metal-Oxide-Semiconductor Transistors and Small-Scale Integrated Circuits By Direct-Write Laser-Induced Pyrolytic Reactions," Applied Physics Letters, American Institute of Physics, New York, US, vol. 43, No. 10, Nov. 1983, pp. 946-948.

Mariucci et al., "Grain boundary location control by patterned metal film in excimer laser crystallized polysilicon," Proceedings of the Figth International COnference on Polycrystalline Semiconductors, Schwabisch Gmund, Germany, Sep. 13-18, 1998, vol. 67-68, pp. 175-180.

Broadbent et al., "Excimer Laser Processing of Al-1%Cu/TiW Interconnect Layers," 1989 Proceedings, Sixth International IEEE VLSI Multilevel Interconnection COnference, Santa Clara, CA, Jun. 12-13, 1989, pp. 336-345.

H.J. Kim and James S. Im, "Grain Boundary Location-Controlled Poly-Si Films for TFT Devices Obtained Via Novel Excimer Laser Process," Abstracts for Symposium of Materials Research Society, Nov. 27 to Dec. 2, 1994, p. 230.

S.D. Brotherton, "Polycrystalline Silicon Thin Film Transistors," 10 Semicond. Sci. Tech., pp. 721-738 (1995).

H. Watanabe et al., "Crystallization Process of Polycrystalline Silicon by KrF Excimer Laser Annealing," 33 Japanese J. of Applied Physics Part 1—Regular Papers Short Notes & Review Papers, pp. 4491-4498 (1994).

E. Fogarassy et al., "Pulsed Laser Crystallization of Hydrogen-Free a-Si Thin Films for High-Mobility Poly-Si TFT Fabrication," 56 Applied Physics A—Solids and Surfaces, pp. 365-373 (1993).

Y. Miyata et al, "Low-Temperature Polycrystalline Silicon Thin-Film Transistors for Large-Area Liquid Crystal Display," 31 Japanese J. Applied Physics part 1—Regular Papers Short Notes & Review Papers, pp. 4559-4562 (1992).

Im et al., "Phase Transformation Mechanisms Involved in Excimer Laser Crystallization of Amorphous Silicon Films," Appl. Phys. Lett., vol. 63 (14), p. 1969 (1993).

Im et al., "On the Super Lateral Growth Phenomenon Observed in Excimer Laser-Induced Crystallization of Thin Si Films," Appl. Phys. Lett., vol. 64 (17), p. 2303 (1994).

Brochure from MicroLas Lasersystem, GmbH, "UV Optics Systems for Excimer Laser Based Micromaching and Marking". No Date.

Ishida et al., "Ultra-shallow boxlike profiles fabricated by pulsed ultraviolet-laser doping process", J. Vac. Sci. Technol. B 12(1), p. 399-403, 1994. (No month).

Yoshimoto, et al., "Excimer-Laser-Produced and Two-Dimensionally Position-Controlled Giant Si Grains on Organic SOG Underlayer", p. 285-286, AM-LCD 2000. No month.

Ozawa et al., "Two-Dimensionally Position-Controlled Exicer-Laser-Crystallization of Silicon Thin Films on Glassy Substrate", Jpn. J. Appl. Phys. vol. 38, Part 1, No. 10, p. 5700-5705, (1999). No month.

I.W. Boyd, Laser Processing of Thin Films and Microstructures, Oxidation, Deposition, and Etching of Insulators (Springer—Verlag Berlin Heidelber 1987).

N. Yamamuchi and R. Reif, J. Appl. Phys 75 (1994) 3235.

T. Noguchi, Jpn. Appl. Phys. 32 (1993) L1585.

Ishihara et al., "A Novel Double-Pulse Exicem-Laser Crystallization Method of Silicon Thin-Films," Japanese Journal of Applied Physics, Publication Office Japanes Journal of Applied Physics, Tokyo, Japan, vol. 34, No. 8A, Aug. 1995, pp. 3976-3981.

Kim, H. J., "Excimer-Laser-Induced Crystallization of Amorophus Silicon Thin Films", Ph. D. Dissertation Abstract, Columbia University, 1996.

* cited by examiner

METHOD AND SYSTEM FOR PROVIDING A THIN FILM WITH A CONTROLLED CRYSTAL ORIENTATION USING PULSED LASER INDUCED MELTING AND NUCLEATION-INITIATED CRYSTALLIZATION

CROSS REFERENCE TO RELATED APPLICATION(S)

The present application is a continuation of International Patent Application No. PCT/US03/09861, filed Apr. 1, 2003, published on Oct. 16, 2003 as International Patent Publication No. WO 03/084688, which claims priority to U.S. Provisional Application Ser. No. 60/369,186, filed on Apr. 1, 2002, the contents of which hereby incorporated by reference in their entireties herein.

NOTICE OF GOVERNMENT RIGHTS

The U.S. Government may have certain rights in this invention pursuant to the terms of the Defense Advanced Research Project Agency award number N66001-9S-1-8913.

FIELD OF THE INVENTION

The present invention relates to a system and process for producing a metal thin film having a uniform crystal orientation and controlled microstructure. In particular, the system and process of the present invention utilize a pulsed laser beam in conjunction with sequential lateral solidification ("SLS") techniques to produce, e.g., an aluminum thin film with, preferably, a (111) crystal orientation.

BACKGROUND OF THE INVENTION

An inherent problem in the production of metallic thin films is minimizing the electro-migration that occurs in the metal interconnects. The electro-migration results in the transport of metal material of an interconnect line, and is caused when free electrons dislodge the atoms of the conductive material upon the current density increase that occurs due to smaller cross-sectional dimensions of the interconnect lines. The electro-migration occurs due to the transfer of momentum from the electrons flowing in a metal conductor when the conductor fails, because of a void or break in the conductor. This phenomenon is generally known as an "electron wind." The failure occurs most often along the grains of the conductive material since the atoms are not as firmly bound along the grains, and the grains provide efficient paths for the electron transport. These grains may extend in a direction which is parallel to the direction of the interconnect lines, i.e., along the direction of the current flow, which is considered to be particularly undesirable (i.e., such grain direction results in an increased electro-migration). If vacancies or voids are formed in the conductive material, the void that is formed reduces the cross-sectional area in a region of the interconnect through which the current may flow, effectively raising the current density of that region of the interconnect even further. Therefore, the void may become so large that an open circuit or a break in the interconnect line results. Alternatively, the atoms of the conducting material that are dislodged may accumulate in a region of the interconnect so as to form a protrusion. If the protrusion becomes large enough, a contact with an adjacent interconnect may occur, thereby causing an undesired connection between the adjacent interconnect lines.

As the features of integrated semiconductor circuit chips are reduced, the cross-section of the metal interconnect lines on the integrated circuit chips are also reduced. This decrease in the cross-sectional dimensions increases the current density in the interconnect lines, which creates increased electro-migration in the metal interconnects. Moreover, the electro-migration would likely increase with a presence of a random orientation of the microstructure of the thin film. Since increasing the grain size to be larger than the metallization line width and preparing semiconductor films with a uniform orientation would reduce the propensity for electro-migration failure, there is a need for a system and method to control crystallization, and produce thin films with the substantially uniform orientation of the microstructure of the thin film.

Control over the thin film microstructure may be obtained through the use of sequential lateral solidification ("SLS") techniques. For example, U.S. Pat. No. 6,322,625 (the "'625 application"), U.S. patent application Ser. Nos. 60/239,194 (the "'194 application"), Ser. No. 09/390,535 (the "'535 application"), Ser. No. 09/390,537 (the "'537 application"), Ser. No. 60/253,256 (the "'256 application"), Ser. No. 09/526,585 (the "'585 application") and International Patent Application Nos. PCT/US01/31391 and PCT/US01/12799, the entire disclosures of which are hereby incorporated herein by reference, describe advantageous apparatus and methods for growing large grained polycrystalline or single crystal structures using energy-controllable laser pulses and small-scale translation of a sample to implement the SLS techniques. As described in these patent documents, at least portions of the semiconductor film on a substrate are irradiated with a suitable radiation pulse to completely or partially melt such portions of the film throughout their thickness. In this manner, when the molten semiconductor material solidifies, a crystalline structure grows into the solidifying portions from selected areas of the semiconductor film which did not undergo a complete melting. Thereafter, the beam pulses irradiate slightly offset from the crystallized areas so that the grain structure extends into the molten areas from the crystallized areas. With the SLS techniques, and the systems described therein, crystallization may be controlled to modify the microstructure of the thin film (e.g., by creating larger grains, single-crystal regions, grain-boundary-location-controlled microstructures), and produce grains with a particular orientation.

SUMMARY OF THE INVENTION

One of the objects of the present invention is to produce at least one section of a metal layer having a uniform crystal orientation and a controlled microstructure. In particular, the present invention may be used to produce an aluminum metal layer having a controlled crystal orientation of microstructures provided therein. For example, a pulsed laser beam may be utilized in conjunction with a sequential lateral solidification ("SLS") technique to produce a (111) crystal orientation of an aluminum thin fin with.

In one exemplary embodiment of the present invention, a method and system are provided for processing a sample having a metal layer to generate a polycrystalline film with a controlled crystal orientation. In particular, at least one portion of the metal layer can be irradiated with a pulsed laser, so that the metal layer is completely melted throughout its entire thickness. Such portion of the metal layer is then resolidified via the crystalline growth, so that the grains of the metal layer have a substantially uniform orientation therein. In another embodiment of the present invention, the metal layer may be deposited on a substrate, which may be done by sputtering, evaporation or any conventional method. In yet another exemplary embodiment, the metal layer may be composed of aluminum or an aluminum alloy (e.g., an aluminum-copper alloy, an aluminum-silicon alloy, an aluminum-copper-silicon alloy etc.) In a further embodiment of the present invention the substantially uniform orientation may be a (111) orientation.

In still another exemplary embodiment of the present invention, the metal layer can be irradiated without patterning (i.e., flood irradiate) to obtain grains with a uniform orientation. The metal layer is then irradiated using the SLS technique, as described in the above-identified patent applications. Certain masks and mask patterns can be used for the SLS techniques to generate various shapes of grain boundaries for modifying the microstructure. This is done by, e.g., creating larger grains, single-crystal regions, grain-boundary-location-controlled microstructures, etc.

In a still further embodiment of the present invention, a mask used during the sequential solidification technique includes a first region capable of attenuating the pulsed laser and a second region which allows substantially the entire intensity of the corresponding portion of the pulsed laser to pass therethrough. The mask may be an inverse dot-patterned mask. The entire thin film can be completely melted throughout its entire thickness and the attenuation may be such that the region of the metal layer corresponding to the first region reaches a lower temperature than the melting temperature of the metal layer and lower than that the temperature of the section of the metal layer irradiated by the beam that is shaped by the second region. In yet another embodiment of the present invention, the dot patterns of the mask can be spaced closer than the super lateral growth distance which is based on the relevant process temperature. The inverse dot-patterned mask can include dots arranged in a geometric pattern such that the microstructure of the metal layer irradiated using such mask crystallizes in substantially the same geometric pattern as the arrangement of the dots of the inverse dot-patterned mask. The dots of the inverse dot-patterned mask may also be arranged to irradiate the metal layer microstructure in a manner to a hexagonal pattern or a square pattern therein.

BRIEF DESCRIPTION OF THE DRAWINGS

For a better understanding of the present invention, together with other and further objects thereof, reference is made to the following description, taken in conjunction with the accompanying drawings, and its scope will be pointed out in the appending claims.

Figure 1:
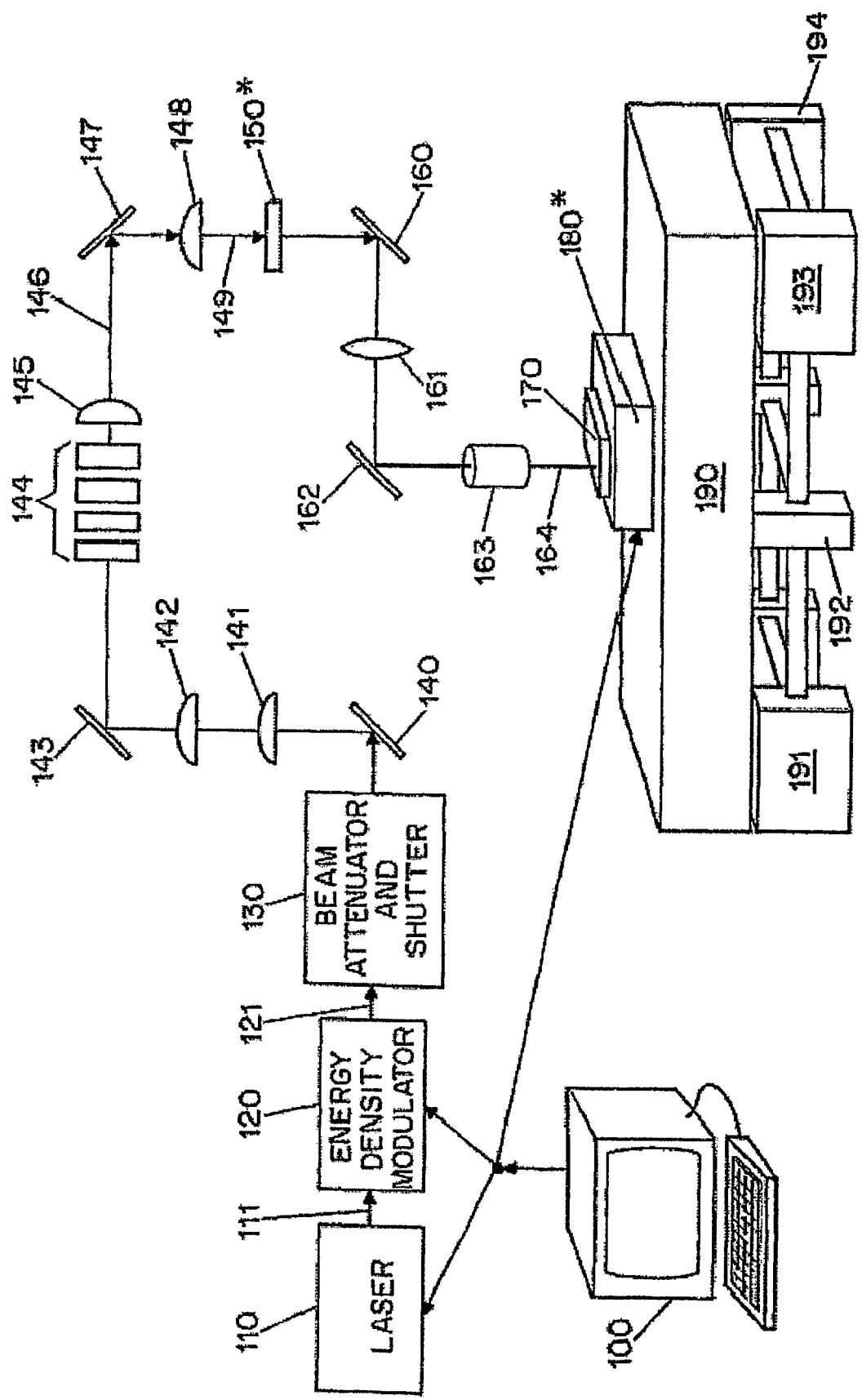
FIG. 1 shows a block diagram of a system for performing a preferred embodiment of a lateral solidification process according to an exemplary embodiment of the present invention.

Throughout the Figures, the same reference numerals and characters, unless otherwise stated, are used to denote like features, elements, components or portions of the illustrated embodiments. Moreover, while the present invention will now be described in detail with reference to the Figures, it is done so in connection with the illustrative embodiments.

DETAILED DESCRIPTION

In one exemplary embodiment of the present invention, a uniform crystalline orientation of at least one section of a metal thin film may be obtained using the sequential lateral solidification process. Therefore, in order to fully understand the present invention, the sequential lateral solidification process is further described. As disclosed in aforementioned patent applications, the sequential lateral solidification ("SLS") process is a technique for producing large grained thin films through small-scale unidirectional translation of a sample between sequential pulses emitted by an excimer laser. As each pulse is absorbed by the sample, a small area of the sample is caused to melt completely, and then resolidify laterally into a crystal region produced by the preceding pulses of a pulse set. It should be understood that various systems according to the present invention may be utilized to generate, nucleate, solidify and crystallize one or more areas on the thin film (e.g., composed of aluminum) which have uniform material therein, such that at least an active region of a thin-film transistor ("TFT") may be placed in such areas. The exemplary embodiments of the systems and processes of the present invention to generate such areas, as well as those of the resulting crystallized metal thin films, shall be described in further detail below. However, it should be understood that the present invention is in no way limited to the exemplary embodiments of the systems, processes and semiconductor thin films described herein.

FIG. 1 shows a system that includes excimer laser 110, energy density modulator 120 to rapidly change the energy density of laser beam 111, beam attenuator and shutter 130, optics 140, 141, 142 and 143, beam homogenizer 144, lens system 145, 146, 148, a mask or masking system 150, lens system 161, 162, 163, incident laser pulse 164, thin metal film sample 170, sample translation stage 180, granite block 190, support system 191, 192, 193, 194, 195, 196, and managing computer 100. As described in further detail in the '535 application, a non-processed thin film sample 170 may be processed into a single or polycrystalline metal thin film by generating a plurality of excimer laser pulses of a predetermined fluence, controllably modulating the fluence of the excimer laser pulses, homogenizing the modulated laser pulses in a predetermined plane, masking portions of the homogenized modulated laser pulses into patterned beamlets, irradiating an amorphous silicon thin film sample with the patterned beamlets to effect melting of portions thereof corresponding to the beamlets, and controllably translating the sample with respect to the patterned beamlets and with respect to the controlled modulation to thereby process the amorphous thin film sample into a single or polycrystalline thin film by sequential translation of the sample relative to the patterned beamlets and irradiation of the sample by patterned beamlets of varying fluence at corresponding sequential locations thereon. The laser system may include a laser source, optics, mask, and projection system, which may be substantially the same as or similar to the equipment used for other SLS systems and processes.

In an exemplary embodiment of the present invention, the method and system may be used to generate metal thin films (e.g., aluminum film) with a uniform crystalline orientation. The thin film may be composed of aluminum alloys such as, e.g., Al—Cu, Al—Si, Al—Cu—Si, etc. In such exemplary embodiment, the concentration of the impurities may preferably be less than 20%.

Figure 2:
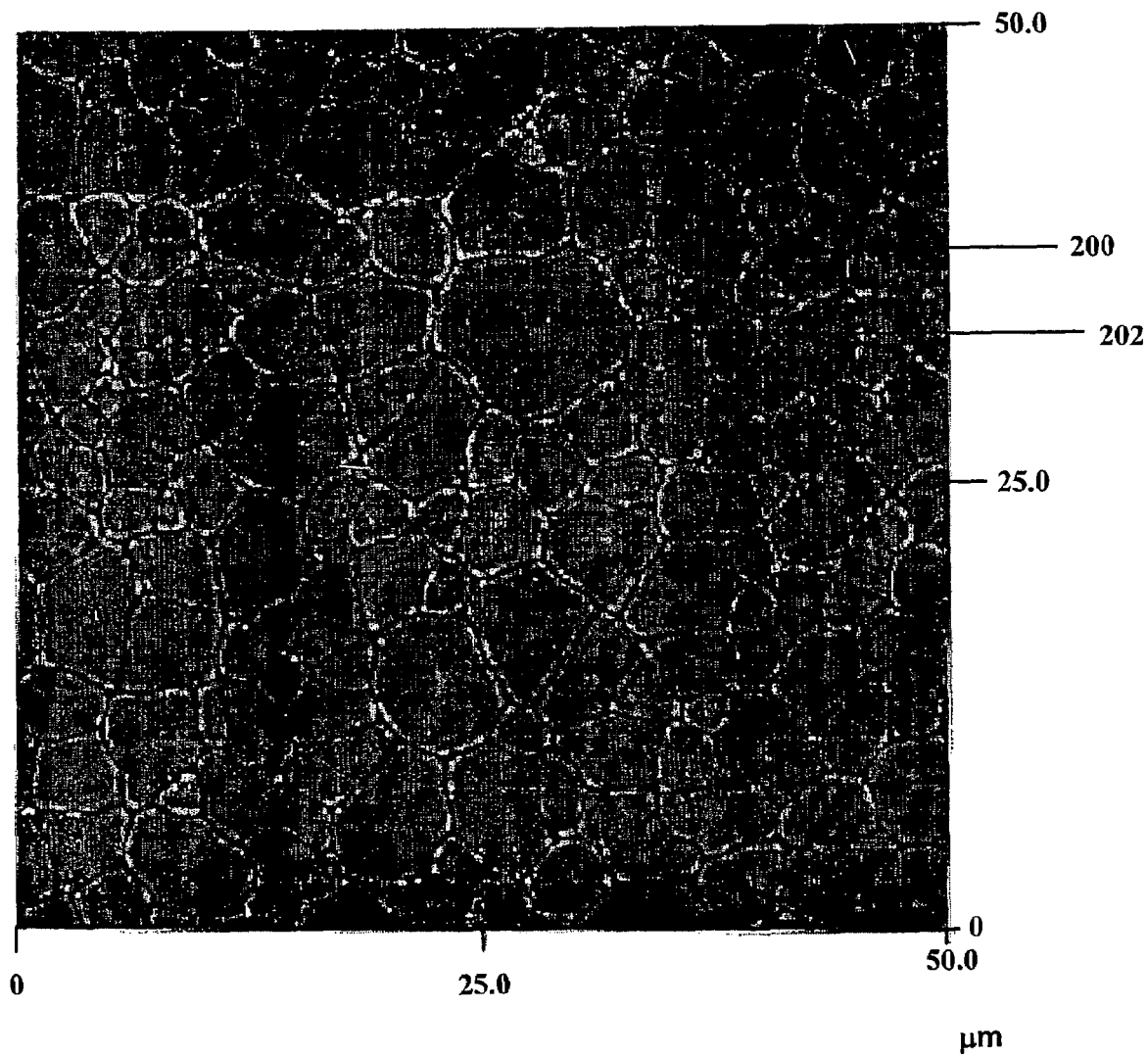
FIG. 2 shows an illustration of a section of an exemplary aluminum thin film sample after pulsed laser irradiation to induce complete melting and subsequent solidification of a section of an aluminum sample.
Figure 3:
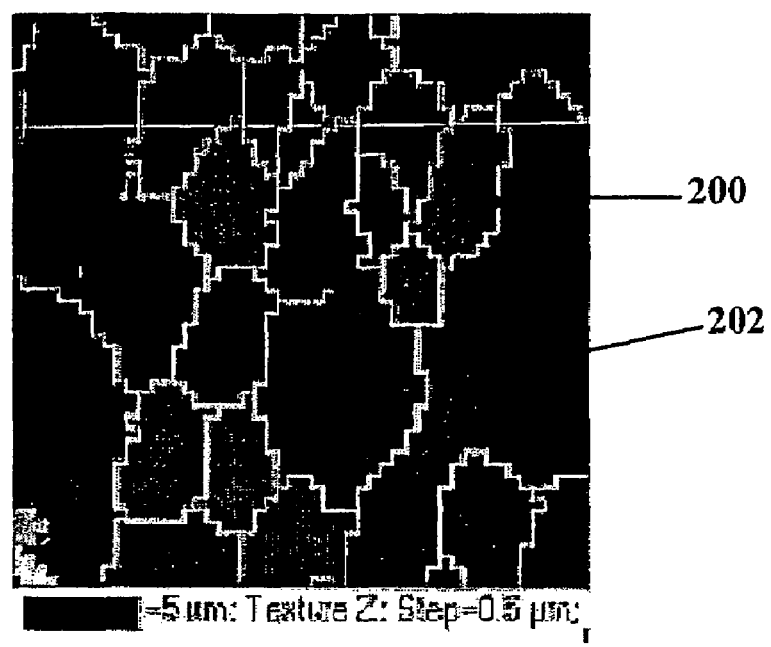
FIG. 3 shows an enlarged representation of a portion of the section illustrated in FIG. 2.

The aluminum thin film sample may be deposited on a substrate by various methods, such as sputtering, evaporation, etc. In one exemplary embodiment of the present invention, it is possible to use the polycrystalline aluminum films without the need to place it on a substrate. In one exemplary embodiment, at least one portion of the aluminum thin film layer is irradiated with a pulsed laser (e.g., an excimer laser) without patterning of the beam pulse (i.e. flood irradiation). The entire portion of the metal layer is completely melted, preferably throughout its entire thickness. The completely melted liquefied section of the aluminum thin film solidifies via nucleation and crystalline growth thus resulting in an aluminum thin film as shown in FIG. 2. FIG. 3 shows a representation of an enlarged portion of the resolidified section illustrated in FIG. 2 indicating that the complete melting and solidification of the section(s) of the aluminum thin film results in grain boundaries 200 and grain shapes 202 that are relatively random.

Figure 4:
FIG. 4 shows inverse pole symbols representing the nucleated aluminum grains of the sample of FIG. 3 illustrating that the nucleated aluminum grains have a (111) orientation.

According to another exemplary embodiment of the present invention, the resolidified (and possibly nucleated) grains of the aluminum layer provided as a substrate can have a substantially uniform orientation after irradiation and solidification. The nucleated aluminum grains likely have a uniform (111) orientation. Such exemplary orientation of the aluminum grains may preferably occur through the heterogeneous nucleation at an interface between liquid aluminum and the substrate. For example, the (111) planes of the aluminum grains likely have the lowest surface energy, which reduces the activation energy for the heterogeneous nucleation. Thus, the (111) orientation of the aluminum grains is thermodynamically preferred according to the present invention. FIG. 4 shows inverse pole symbols representing an exemplary portion of the resolidified section of the aluminum thin film of FIG. 2 illustrating that the crystallized aluminum grains have various orientations, and in particular, a (111) orientation. In an exemplary embodiment of the system and process according to the present invention, it is possible to obtain the (111)-oriented polycrystalline aluminum films by positioning the sample 170 in a predetermined manner and subjecting the thin film to the SLS processing. This can be done after the thin film is subject to flood irradiation.

In another exemplary embodiment of the present invention, it is possible to initially irradiate a portion of the aluminum thin film sample without patterning (i.e., by flood irradiating), so as to allow the irradiated portions of thin film to solidify, so as to obtain grains having a (111) orientation, and then irradiate such previously-irradiated portion of the metal layer using the SLS process, as described in the above-identified patent applications and patents. Depending on the masks and their mask patterns (the examples of which are described and shown in the above-identified applications and patents), it is possible to generate various shapes of grain boundaries so as to modify the metal microstructure and the orientation of the grains thereof (e.g., by creating larger grains, single-crystal regions, grain-boundary-location-controlled microstructures, etc.).

Figure 5:
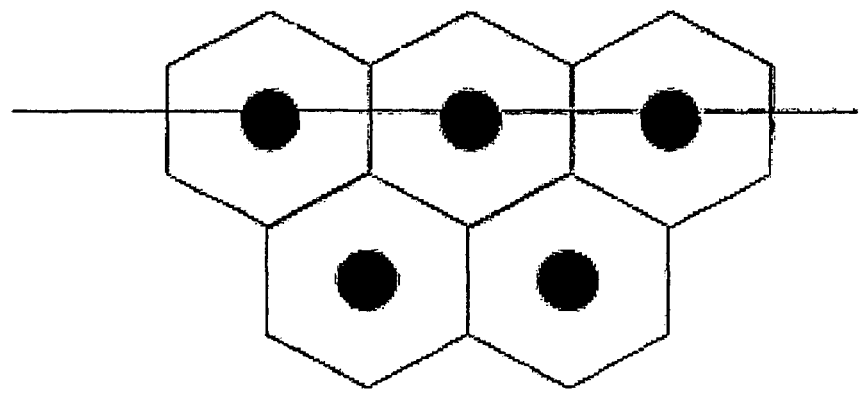
FIG. 5 shows an exemplary embodiment of an inverse dot-patterned mask with the dot patterns arranged in a hexagonal form, which may be used with the exemplary system and process according to the present invention.
Figure 6:
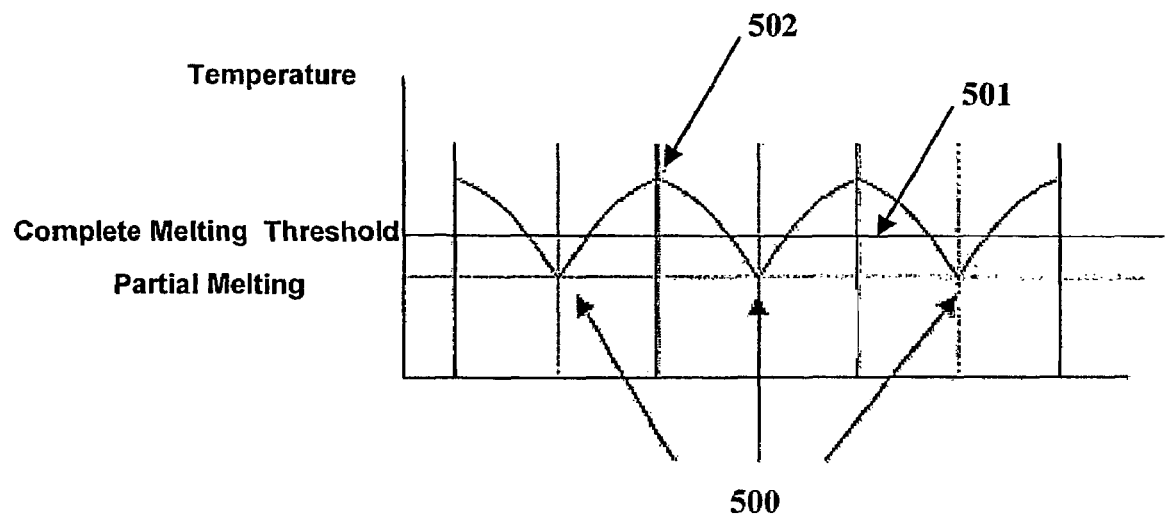
FIG. 6 shows an exemplary temperature profile of the melted aluminum thin film sample after irradiation of a portion thereof with the inverse dot-patterned mask of FIG. 5.

The mask 150 may include a first region capable of attenuating the pulsed laser and a second region that allows the associated portions of complete pulsed laser to irradiate therethrough. For example, an inverse dot-patterned mask may be used in which the dots are arranged in a geometric pattern such that the microstructure of the metal layer crystallizes substantially corresponds to the geometric shape of the arrangement of the dots of the mask pattern. In a further embodiment of the present invention, similarly to the conventional SLS techniques which utilize dot-patterned masks, the dot patterns on such mask should be spaced closer to one another than the super lateral growth distance corresponding to the relevant process temperature. As described in the applications and patents identified herein above, the dot regions of the inverse dot patterned mask may be arranged to form a metal layer with a hexagonal microstructure as shown in FIG. 5. In particular, the exemplary mask of FIG. 5 includes a first region 500 that attenuates the beam intensity and a second region 502 that allows the beam to pass therethrough to reach and irradiate the aluminum thin film. It is preferable for the energy density of the beam to be large enough to completely melt the intended sections of the aluminum thin film, including the regions masked by the dots 500. Since the dots 500 are opaque, and the beam is significantly attenuated in those regions, the aluminum thin film area positioned to be irradiated by the dot regions (although completely melted) would likely not reach as high of a temperature as that of the areas outside the dot regions (which are also completely melted) as is shown in FIG. 6. In particular, the temperature 501 in the attenuated region of the aluminum thin film should be lower than the melting temperature of the film so that at least some of (111) nucleated grains that are formed remain as solids (e.g., via a previous irradiation such as the flood irradiation) to seed the molten metal around those solid regions into the (111) oriented grains.

Figure 7:
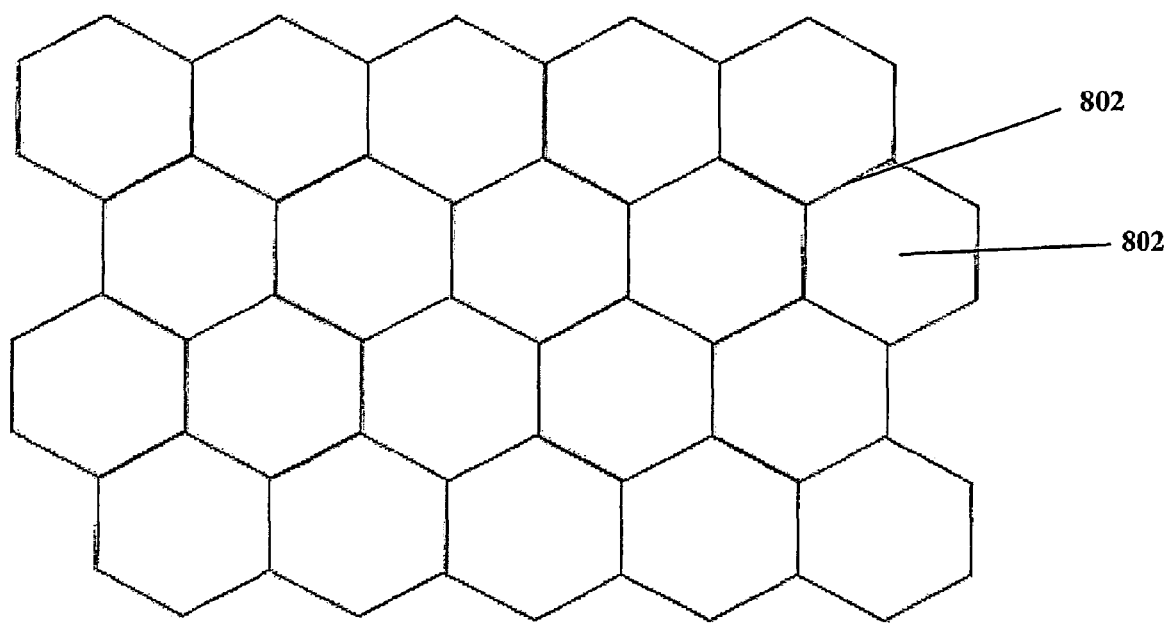
FIG. 7 shows an exemplary section of the sample after the Sequential lateral solidification ("SLS") is utilized using the inverse dot-patterned mask of FIG. 5.
Figure 8:
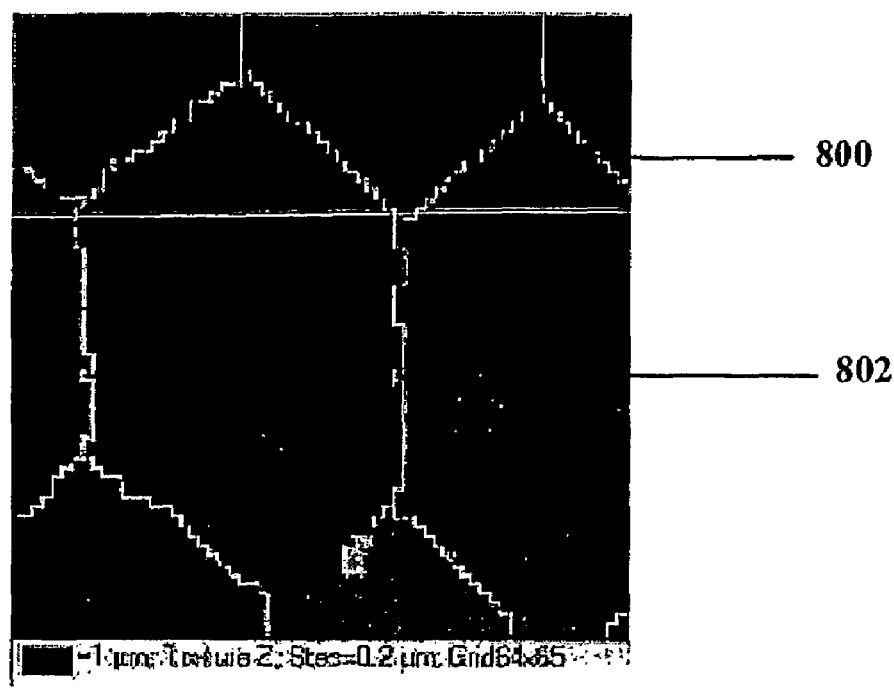
FIG. 8 shows an enlarged illustration of approximately hexagonal portions of the sample shown in FIG. 7.
Figure 9:
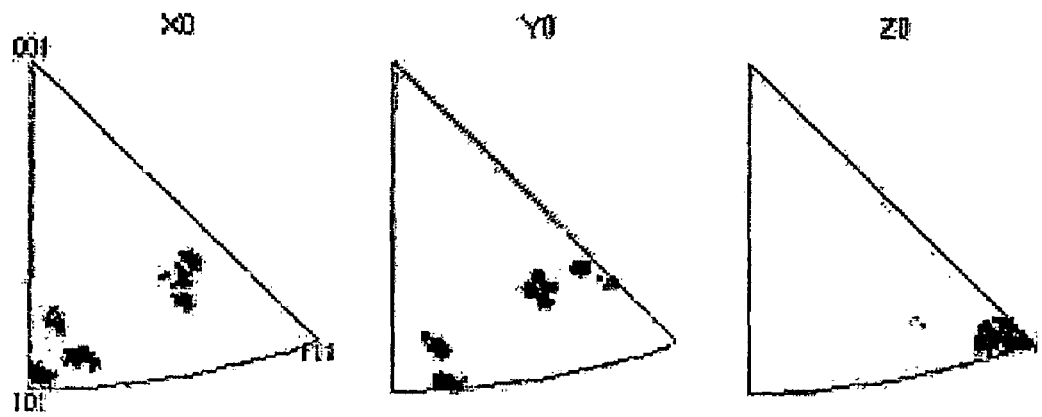
FIG. 9 shows inverse pole symbols representing nucleated aluminum grains of the sample of FIGS. 7 and 8 illustrating that the nucleated aluminum grains have a (111) orientation.

As the film cools, the section of the aluminum thin film irradiated by the section of the laser beam masked the dot regions nucleates, thus, providing the (111) oriented seeds that grow laterally into the non-masked areas in accordance with the principles of SLS techniques described in the above-identified U.S. and International patent applications and patents. In particular the dot-patterned SLS techniques described therein. As described in these patent documents, the microstructure that is obtained depends on the geometry of the dot regions of the mask 150. Therefore, as shown in FIGS. 7 and 8, the use of the exemplary inverse dot-patterned mask of FIG. 5 to mask the laser beam and irradiate the aluminum thin film results in crystallized aluminum film with a hexagonal microstructure. FIG. 8 shows an enlarged representation of a portion of the section provided in FIG. 7 further illustrating the locations and shapes of the grain boundaries 800, 802, respectively. FIG. 9 shows inverse pole symbols representing the portion of the section provided in FIG. 8 that illustrate that the crystallized aluminum grains have substantially a (111) orientation. In a further exemplary embodiment of the present invention, the dot regions of the inverse dot patterned mask may be arranged so as to generate the sections of the metal thin film with square microstructure therein.

Figure 10:
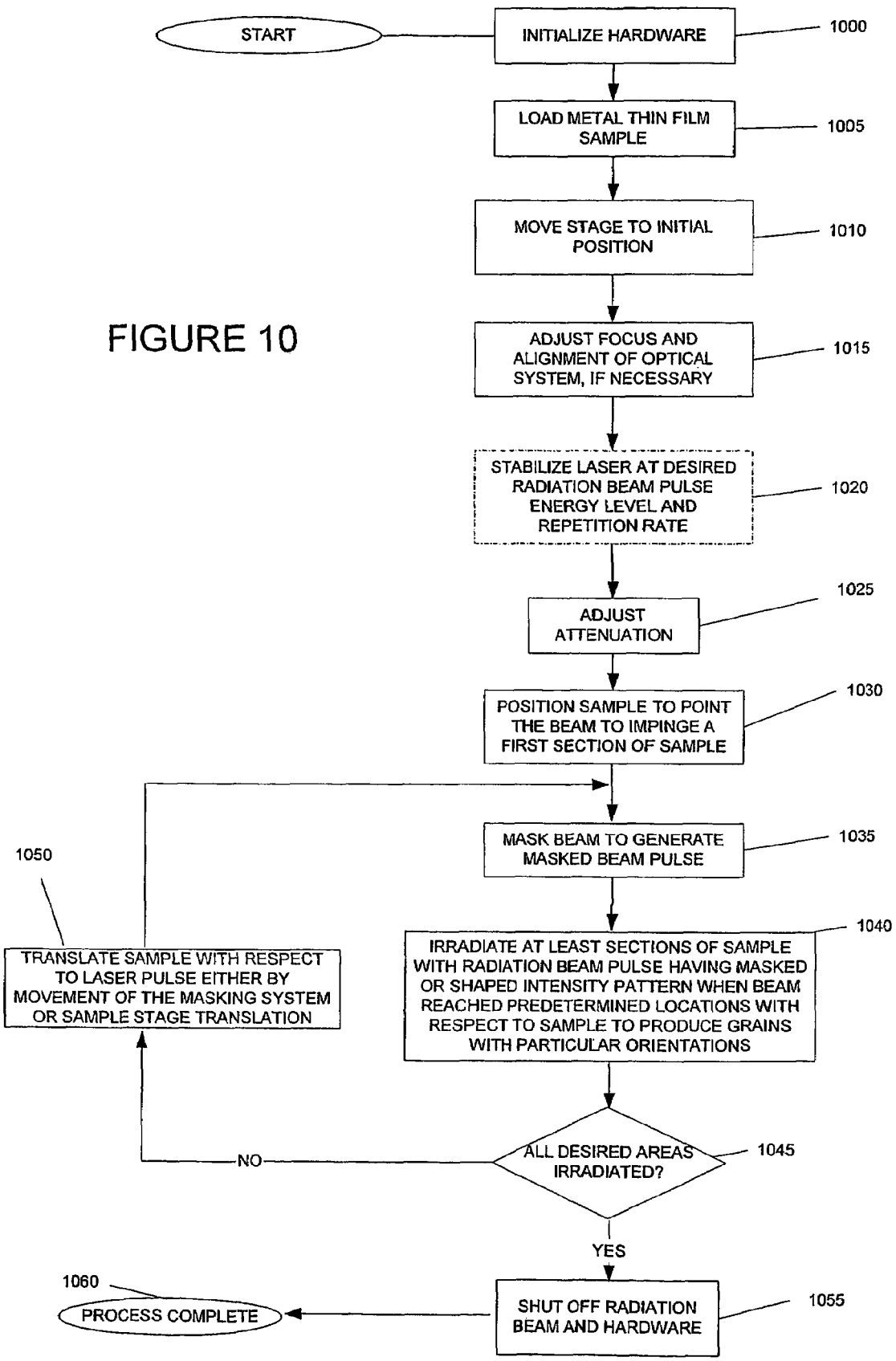
FIG. 10 shows a flow diagram of an exemplary embodiment of a method according to the present invention which can be implemented by the system of FIG. 1.

Referring to FIG. 10, exemplary steps executed by computer 100 of FIG. 1 to control the irradiation and grain orientation of the metal thin film is described. The various electronics of the system shown in FIG. 1 are initialized by the computer to initiate the process in step 1000. A thin metal (aluminum) film sample 170 is then loaded onto the sample translation stage in step 1005. It should be noted that such loading may be either manual or robotically implemented under the control of the computer 100.

Next, the sample translation stage 180 is moved into an initial position in step 1010, which may include an alignment with respect to reference features on the sample 170. The various optical components of the system are focused in step 1015 if necessary. The laser is then stabilized in step 1020 to a desired energy level and repetition rate, as needed to fully melt the metal thin film sample 170 in accordance with the particular processing to be carried out. If necessary, the attenuation of the laser pulses is finely adjusted (step 1025).

Next, the sample 170 is positioned to point the beam to impinge on the first section of sample in step 1030. The beam 149 is masked with the appropriate mask pattern of the mask 150 (step 1035). It is also possible to not mask the beam prior to its impingement of the sample 170. After the beam 149 is masked to become a masked beam pulse 164, the masked beam pulse 164 irradiates at least one section of the metal (aluminum) thin film sample 170 to produce grains that have a particular (e.g., −111) orientation in step 1040. Then, in step 1045, it is determined whether all intended areas of the thin metal film sample 170 have been irradiated in a predetermined manner. If not, the sample 170 is then translated in the X and/or Y directions in step 1050 for a distance which is less than the super lateral grown distance of the metal thin film using the SLS and/or non-SLS techniques. After processing all of the desired sections of the metal thin film sample 170, the beam and hardware are shut off in step 1055 and the process is completed in step 1060. If processing of additional samples is desired or steps 1005-1050 may be repeated for each such sample.

In addition, it is also possible to obtain the (111) oriented grains using the SLS techniques described above and without the flood irraditions being effectuated on the aluminum thin film prior to such SLS processing. In particulars, the desired sections of the aluminum thin film 170 are irradiated using the one of the patterned masks described above (e.g., the dot-patterned mask, the hexagonal-shaped mask, the rectangular shaped mask, etc.) and the SLS techniques in order to nucleate center areas corresponding to the such shapes (which allow some or all of the irradiation of the beam pulse to pass therethrough). The resolidified desired regions of the aluminum thin film 170 result in the (111) oriented grains, which are also grain boundary controlled grains. Accordingly, it is not necessary to subject the aluminum thin film 170 to flood irradiation prior to it being irradiated using the SLS processing technique.

The foregoing merely illustrates the principles of the invention. Various modifications and alterations to the described embodiments will be apparent to those skilled in the art in view of the teachings herein. For example, while the above embodiment has been described with respect to at least partial lateral solidification and crystallization of the semiconductor thin film, it may apply to other materials processing techniques, such as micro-machining, photo-ablation, and micro-patterning techniques, including those described in the above-identified patent documents. The various mask patterns and intensity beam patterns described in the above-referenced patent application may also be utilized with the process and system of the present invention. It will thus be appreciated that those skilled in the art will be able to devise numerous systems and methods which, although not explicitly shown or described herein, embody the principles of the invention and are thus within the spirit and scope of the present invention.

The invention claimed is:

1. A system for producing at least one section of a polycrystalline metal film with a substantially uniform orientation that inhibits electro-migration, comprising:
a logic arrangement which is operable to:
  (a) irradiate at least one portion of the at least one section of the metal thin film to completely melt the at least one portion of the metal thin film throughout its entire thickness, and
  (b) allow the at least one portion of the melted metal thin film to re-solidify after the at least one is melted, wherein the grains of the at least one portion have the substantially uniform orientation that inhibits electro-migration upon the re-solidification, and
  (c) irradiate at least one portion of the at least one section of the metal thin film using a sequential lateral solidification technique.

2. The system according to claim 1, wherein the metal thin film is deposited on a substrate.

3. The system according to claim 2, wherein the metal thin film is deposited on a substrate by at least one of a sputtering procedure, an evaporation procedure and a further thin film deposition procedure.

4. The system according to claim 1, wherein the metal thin film is composed of aluminum.

5. The system according to claim 1, wherein the metal thin film is composed of an aluminum alloy, the aluminum alloy including at least one of an aluminum-copper alloy, an aluminum-silicon alloy and an aluminum-copper-silicon alloy.

6. The method according to claim 1, wherein the substantially uniform orientation is a (111) orientation.

7. The system according to claim 1, wherein the laser pulse irradiating the at least one portion is patterned using a mask to modify a shape of the laser pulse.

8. The system according to claim 7, wherein the mask is comprised of a first region capable of attenuating the pulsed laser and a second region allowing a significant section of the laser beam impacting the second region to pass therethrough.

9. A system for producing at least one section of a polycrystalline metal film with a substantially uniform orientation, comprising:
a logic arrangement which is operable to:
  (a) irradiate using a laser pulse having a shape at least one portion of the at least one portion section of the metal thin film to completely melt the at least one portion of the metal thin film throughout its entire thickness, wherein the laser pulse irradiating the at least one portion is patterned using an inverse dot-patterned mask to modify the shape of the laser pulse, wherein the mask comprises a first region capable of attenuating the laser pulse and a second region allowing a significant section of the laser pulse impacting the second region to pass therethrough, the second region including opaque array patterns which include at least one of dot-shaped areas, hexagonal shaped areas and rectangular shaped areas, and
  (b) allow the at least one portion of the melted metal thin film to re-solidify after the at least one is melted, wherein the grains of the at least one portion have the substantially uniform orientation upon the re-solidification.

10. The system according to claim 9, wherein each portion of the metal thin film is completely melted throughout its entire thickness, and wherein an attenuation of the laser beam produced by the first region impinges associated section of the thin film to reach a temperature that is lower than a melting temperature of the metal thin film and lower than a temperature as further sections of the thin film corresponding with the areas irradiated by the second region.

11. The system according to claim 10, wherein dot patterns of the mask are spaced closer than a super lateral growth distance corresponding to a resolidification process temperature of the metal thin film.

12. The system according to claim 11, wherein the inverse dot-patterned mask is comprised of dots has a geometric pattern such that upon the irradiation of the metal thin film, a microstructure of the metal thin film solidifies and crystallizes in substantially the same geometric pattern as the pattern of the inverse dot-patterned mask.

13. The system according to claim 12, wherein the dots of the inverse dot-patterned mask are arranged in a pattern such that upon the irradiation of the metal thin film with the masked laser beam, a microstructure of the metal thin film is formed having one of a hexagonal pattern, a rectangular pattern and a square pattern.

14. The system according to claim 1, wherein the logic arrangement irradiates the at least one portion of metal using a sequential lateral solidification technique, and wherein, upon the completion of step (b), grain-boundary location controlled grains are formed in the at least one portion of the metal thin film.

* * * * *